(12) United States Patent
Perner

(10) Patent No.: US 6,930,914 B2
(45) Date of Patent: Aug. 16, 2005

(54) METHODS FOR ISOLATING MEMORY ELEMENTS WITHIN AN ARRAY

(75) Inventor: Frederick A. Perner, Palo Alto, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 39 days.

(21) Appl. No.: 10/425,362

(22) Filed: Apr. 29, 2003

(65) Prior Publication Data

US 2004/0218419 A1 Nov. 4, 2004

(51) Int. Cl.[7] .............................................. G11C 11/14
(52) U.S. Cl. .................. 365/171; 365/173; 365/230.03
(58) Field of Search ................................ 365/171, 173, 365/230.03, 230.06

(56) References Cited

U.S. PATENT DOCUMENTS

| | | | | | |
|---|---|---|---|---|---|
| 4,789,967 | A | * | 12/1988 | Liou et al. | 365/218 |
| 5,526,318 | A | * | 6/1996 | Slemmer et al. | 365/226 |
| 5,774,405 | A | * | 6/1998 | Tomishima | 365/226 |
| 6,473,335 | B2 | * | 10/2002 | Bohm et al. | 365/158 |
| 6,684,298 | B1 | * | 1/2004 | Dwarkadas et al. | 711/128 |

* cited by examiner

Primary Examiner—Tan T. Nguyen

(57) ABSTRACT

Memory arrays and methods are disclosed for incorporating repeater circuitry in a memory array. The method may include coupling a plurality of memory arrays to a conductor, where the arrays may include memory elements. In addition, current drivers also may be coupled to the conductor. The current drivers may allow memory elements that are located in separate memory arrays to be isolated from each other.

22 Claims, 5 Drawing Sheets

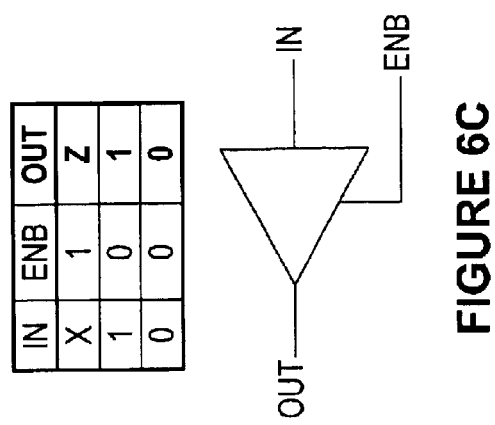
FIGURE 6C
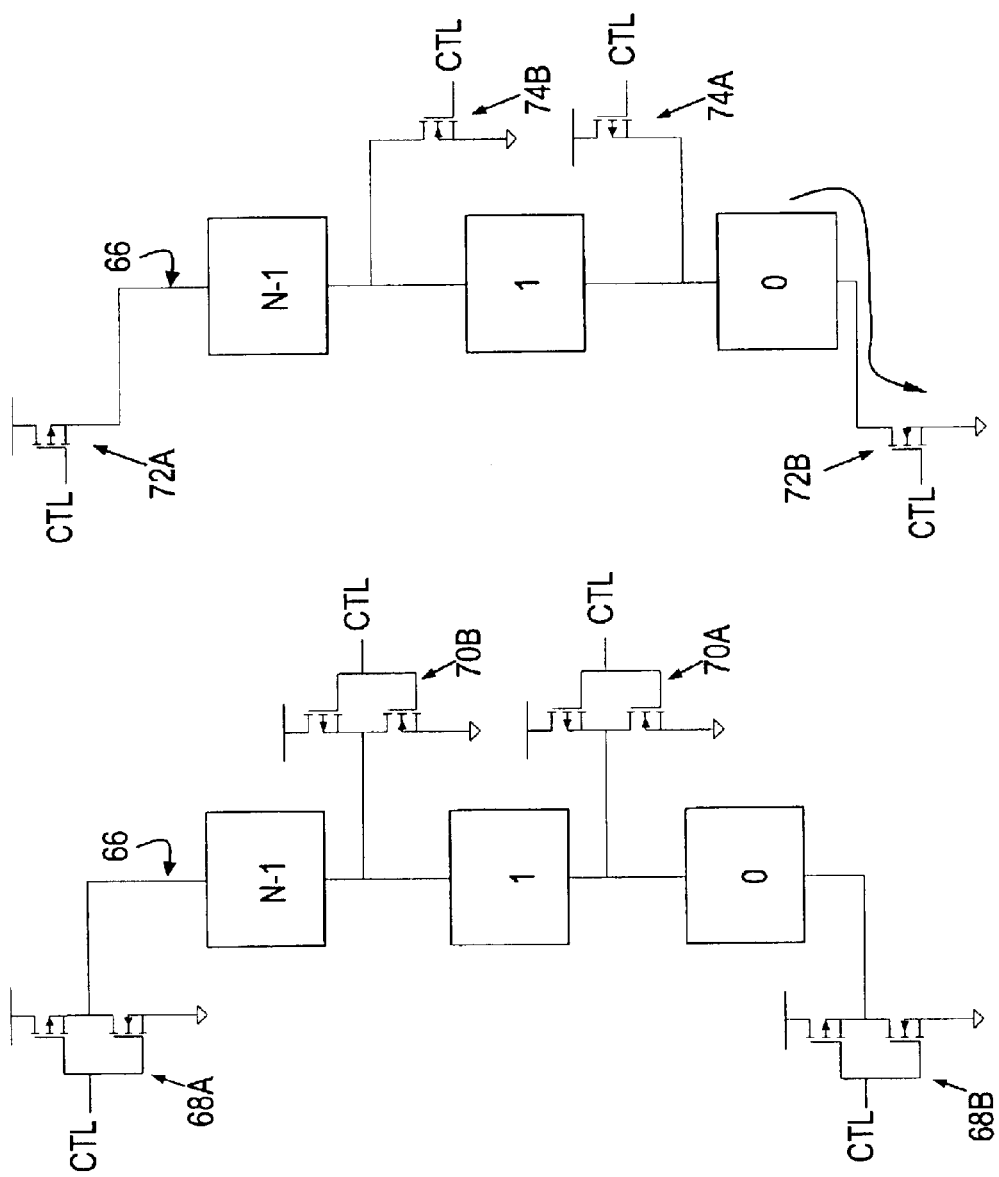
FIGURE 6B
FIGURE 6A

METHODS FOR ISOLATING MEMORY ELEMENTS WITHIN AN ARRAY

BACKGROUND

Computers have become an integral part of society. Computers are complex and may include microprocessors, storage media (e.g., CD-ROM, hard drive, floppy drive, etc.), memory, and input/output devices. In general, a microprocessor executes instructions from various software programs that may be running on the computer. While running the programs, the microprocessor may need to read and write information to and from memory.

Recent trends in memory include solid state magnetic memory arrays. Magnetic memory arrays may have advantages over non-magnetic memory arrays (e.g., DRAM) because, among other things, they do not need to be refreshed. Magnetic memory arrays also offer the potential for very dense packing of memory elements.

Increasing the density of the memory elements may create problems in routing data between the memory elements and other areas of the chip. As the number of memory elements on chip increases, the conductors that route data may need to be longer. Consequently the circuitry used in accessing and asserting data on the conductors may drastically increase in size to accommodate the increases in conductor length. In some cases, the increases in the size of the access circuitry may be limiting on the overall design of the memory array.

BRIEF SUMMARY

A memory is disclosed that may implement a method for isolating memory elements. The method may include coupling a plurality of memory arrays to a conductor, where the arrays may include memory elements. In addition, current drivers also may be coupled to the conductor. The current drivers may allow memory elements that are located in separate memory arrays to be isolated from each other.

BRIEF DESCRIPTION OF THE DRAWINGS

For a detailed description of the preferred embodiments of the invention, reference will now be made to the accompanying drawings in which:

FIG. 6A shows a continuous write conductor coupled to a plurality of memory sub-arrays in accordance with various embodiments of the invention;

FIG. 6B shows a continuous write conductor coupled to a plurality of memory sub-arrays in accordance with various embodiments of the invention;

FIG. 6C shows possible driver circuitry and a truth table in accordance with various embodiments of the invention.

NOTATION AND NOMENCLATURE

Certain terms are used throughout the following description and claims to refer to particular system components. As one skilled in the art will appreciate, electronics companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ".

The term "couple" or "couples" is intended to mean either an indirect or direct electrical connection. Thus, if a first device couples to a second device, that connection may be through a direct electrical connection, or through an indirect electrical connection via other devices and connections.

The term "chip" is intended to refer to both packaged and unpackaged integrated circuits of any variety. For example, although memory chips are disclosed, one of skill will appreciate that other chips, such as microprocessors, often contain memory or similarly-packed arrays of integrated devices, and therefore may employ the concepts disclosed herein.

As used herein, the term "array" is intended to refer to a group of interconnected memory elements. The term "sub-array" is intended to refer to an array of memory elements along with the circuitry that may be used in reading and writing information from and to the memory array. The term "macro-array" is intended to refer to one or more sub-arrays integrated in a chip.

DETAILED DESCRIPTION

The following discussion is directed to various embodiments of the invention. Although one or more of these embodiments may be preferred, the embodiments disclosed should not be interpreted or otherwise used as limiting the scope of the disclosure, including the claims. In addition, one skilled in the art will understand that the following description has broad application, and the discussion of any embodiment is meant only to be exemplary, and is not intended to intimate that the scope of the disclosure, including the claims, is limited to these embodiments.

Figure 1:
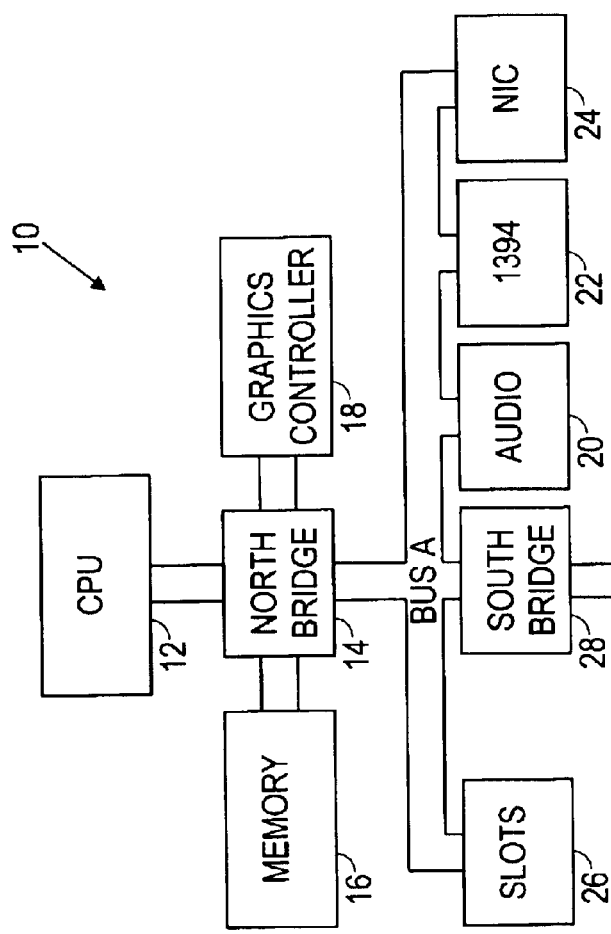
FIG. 1 shows an exemplary computer system.

FIG. 1 illustrates an exemplary computer system 10. The computer system of FIG. 1 includes a central processing unit ("CPU") 12 that may be electrically coupled to a bridge logic device 14 via a CPU bus. The bridge logic device 14 is sometimes referred to as a "North bridge." The North bridge 14 typically also electrically couples to a main memory 16 by a memory bus, and may further electrically couple to a graphics controller 18 via an accelerated graphics port ("AGP") bus. Main memory 16 may be a magnetic memory utilizing the methods for conveying data on a memory chip disclosed below. The North bridge 14 typically couples CPU 12, memory 16, and graphics controller 18 to the other peripheral devices in the system through, for example, a primary expansion bus ("BUS A") such as a PCI bus or an EISA bus. Various components that operate using the bus protocol of BUS A may reside on this bus, such as an audio device 20, an IEEE 1394 interface device 22, and a network interface card ("NIC") 24. These components may be integrated onto the motherboard, as suggested by FIG. 1, or they may be plugged into expansion slots 26 that are connected to BUS A. If other secondary expansion buses are provided in the computer system, as is typically the case, another bridge logic device 28 may be used to electrically couple the primary expansion bus, BUS A, to a secondary expansion bus. This bridge logic 28 is sometimes referred to as a "South bridge."

Figure 2:
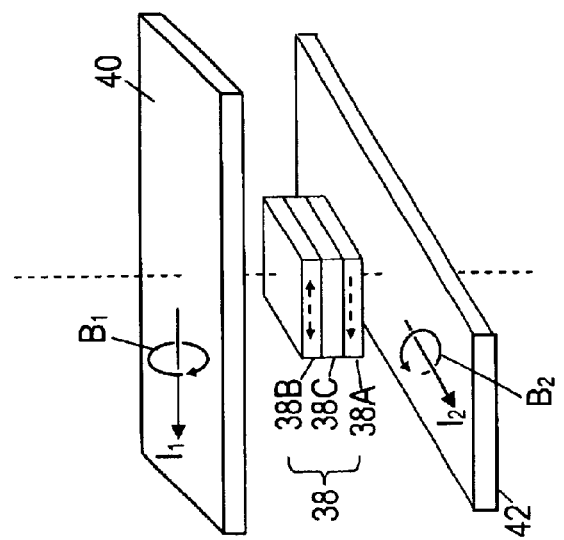
FIG. 2 shows an exemplary magnetic memory element.

Main memory 16 may include magnetic memory elements or bits, where information may be stored in the memory elements by altering their magnetic state. FIG. 2 shows a possible implementation of a memory element 38. Memory element 38 may include a layer 38A whose magnetic field has been fixed in a direction as shown by the single sided arrow. Memory element 38 may also include another layer 38B, located above layer 38A, with an insulating layer 38C disposed between them. In this manner, layers 38A and 38B form a sandwich-like structure around layer 38C. As shown, the direction of the magnetic field of layer 38B may be adjusted to be parallel to the magnetic field of layer 38A (i.e., arrows in the same direction), or anti-parallel to the magnetic field of layer 38A (i.e., arrows in opposite directions). By varying the relative magnetic orientations (parallel or anti-parallel) of layers 38A and 38B, the electrical resistance through layer 38C may be varied, so that digital values may be assigned to the resistance of the memory element 38.

In order to store data to memory element 38, orthogonal write lines 40 and 42 may be employed, where their crossing-point—as indicated by the dashed line in FIG. 2—may be aligned with memory element 38. Note that the separation distance shown in FIG. 2 between the write lines 40 and 42 and the memory element 38 is exaggerated for clarity, and the actual separation distance may be on the order of a few hundred angstroms or less. In addition, alternative conductor configurations (e.g., two-conductor) may have lines 40 and 42 in direct physical contact with memory element 38 with no dielectric separating the memory element 38 from either line 40 or 42. Driver circuitry (not specifically shown in FIG. 2), may be electrically coupled to write lines 40 and 42 to provide electrical currents $I_1$ and $I_2$.

Current $I_1$ in write line 40 may generate a magnetic field $B_1$, and likewise current $I_2$ in write line 42 may generate a magnetic field $B_2$. Magnetic fields $B_1$ and $B_2$ may then collectively contribute to the magnetic field induced in memory element 38, where the magnetic fields $B_1$ and $B_2$ may be adjusted by adjusting the strength and direction of currents $I_1$ and $I_2$. For example, reversing the direction of the currents $I_1$ and $I_2$ will reverse the direction of the magnetic fields $B_1$, and $B_2$. Collectively, the magnetic fields $B_1$ and $B_2$ may be sufficient to set and switch the orientation of layer 38B. Accordingly, the direction of the magnetic fields in layers 38A and 38B may be adjusted to be parallel or anti-parallel. The magnetic field $B_1$ may be used to simply increase the susceptibility of layer 38B, and magnetic field and $B_2$ may be used to determine the orientation of layer 38B. The magnetic orientation of layer 38B may be determined by the direction of current flowing in conductor 42, so a bi-directional current flow may be supported in conductor 42. Conversely, as conductor 40 may be used solely to increase susceptibility, support for a uni-directional current flow in conductor 40 may be sufficient.

Figure 3:
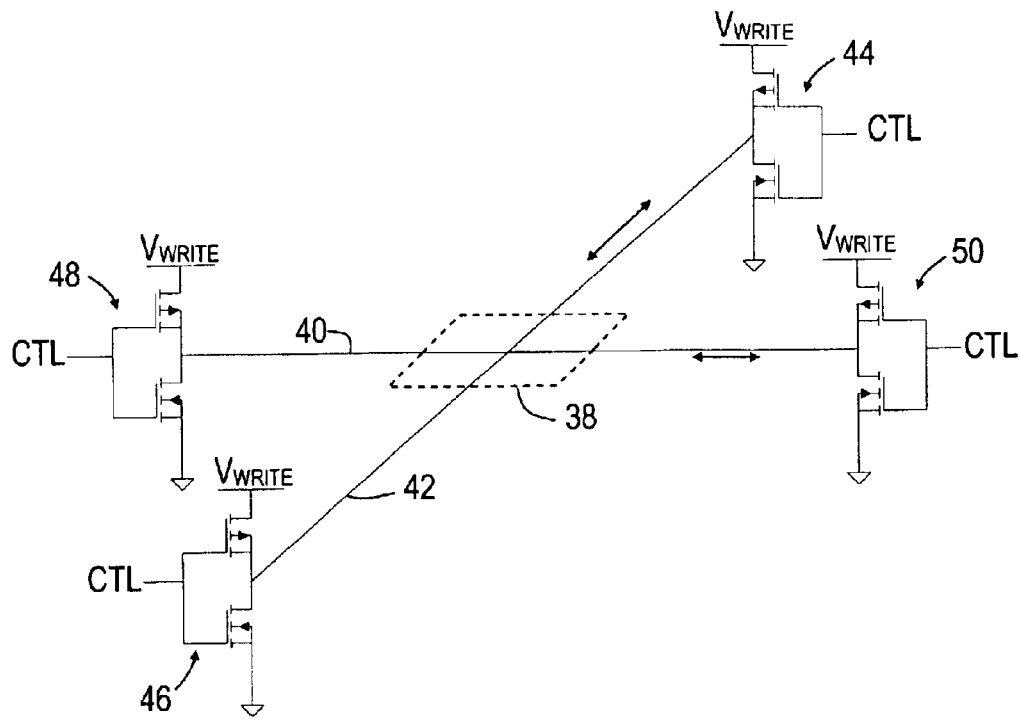
FIG. 3 shows driver circuitry coupled to a magnetic memory element.

FIG. 3 shows circuitry that may be used in writing values to magnetic memory elements, such as magnetic memory element 38 (shown as a dashed box in FIG. 3). Write conductors 40 and 42 may be coupled to write conductor drivers 44–50. Drivers 44–50 may include a p-channel metal oxide semiconductor ("PMOS") transistor coupled between a voltage source $V_{WRITE}$ and the write conductor. The voltage source $V_{WRITE}$ may be a predetermined voltage or may be variable in order to allow greater control in the amount of current in the write conductors, for example, by adjusting the value of $V_{WRITE}$. In addition, drivers 44–50 also may include an n-channel metal oxide semiconductor ("NMOS") transistor coupled between the write conductor and ground. The amount and direction of current in write conductors 40 and 42 may be controlled by modulating the voltage on the CTL node of drivers 44–50. For example, if it is desired to flow current in conductor 42 from driver 44 to driver 46 then the CTL node of driver 44 may be coupled to ground and the CTL node of driver 46 may be coupled to $V_{WRITE}$. In this manner the PMOS of driver 44 may couple one end of write conductor 42 to $V_{WRITE}$, while the NMOS of driver 44 may be off. Likewise, with the CTL node of driver 46 coupled to $V_{WRITE}$, the NMOS of driver 46 may couple the other end of write conductor 42 to ground, while the PMOS of driver 46 may be off. The size of the transistors contained in drivers 44–50 may also affect the amount of current that may be provided in write conductors 40 and 42, and consequently the magnetic field induced in memory element 38.

Figure 4:
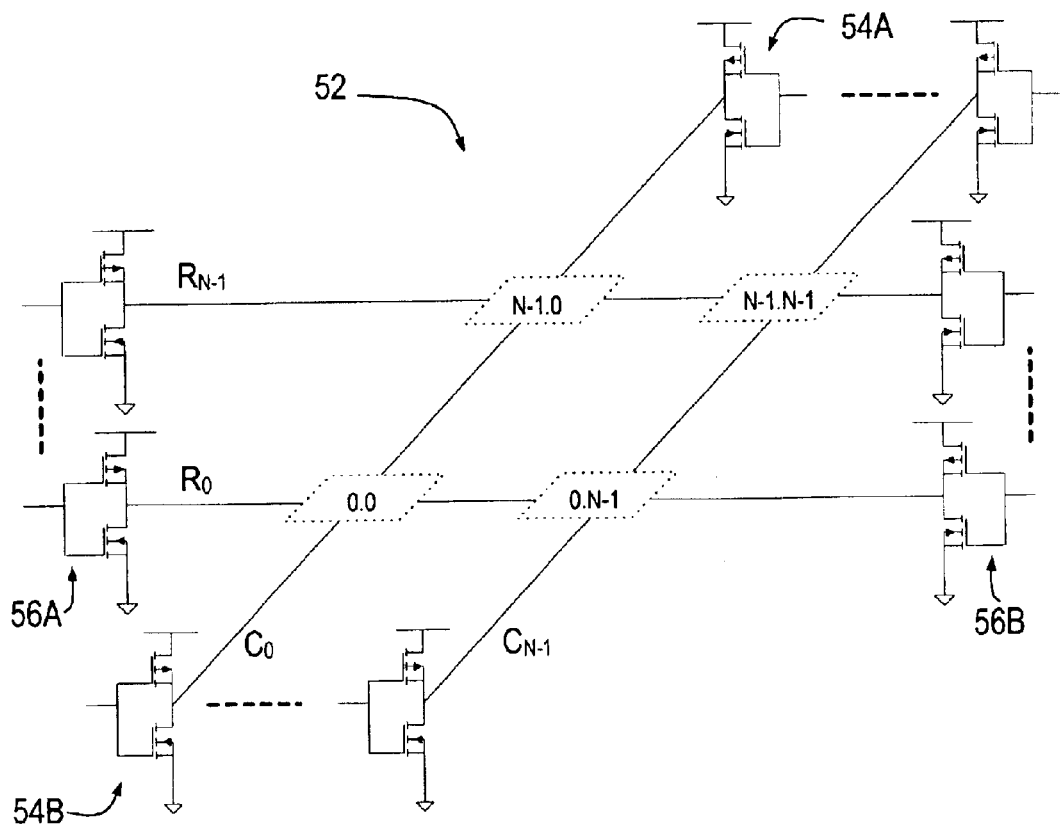
FIG. 4 shows driver circuitry coupled to an array of memory elements.

FIG. 4 shows the memory elements manufactured in an array 52, where the memory elements may be coupled together in rows and columns. The write conductor 40 (shown in FIG. 2) may correspond to one of the rows $R_0$–$R_{N-1}$ shown in FIG. 4. Likewise, the write conductor 42 (shown in FIG. 2) may correspond to one of the columns $C_0$–$C_{N-1}$ shown in FIG. 4. Individual memory elements within array 52 may be designated with respect to the row R and column C that they may be located in. For example, memory element "0.0" may represent the memory element located at the intersection of row $R_0$ and column $C_0$. Information may be written to memory element 0.0 using column driver circuitry and row driver circuitry. For example, driver 54A may couple one end of column $C_0$ to $V_{WRITE}$ while the other end of column $C_0$ may be coupled to ground by driver 54B. Also, driver 56A may couple one end of row $R_0$ to $V_{WRITE}$ while the other end of row $R_0$ may be coupled to ground by driver 56B. With current flowing in the row $R_0$ and column $C_0$, the digital value of memory element 0.0 may be modified.

Although the current in row $R_0$ and in column $C_0$ may induce magnetic fields in other memory elements coupled to row $R_0$ and column $C_0$, their digital value may remain unchanged because current does not flow in both their rows and columns. For example, although current in row $R_0$ may induce a magnetic field in layer 38B (as shown in FIG. 2) of memory element 0.N-1, little or no current may flow in column $C_{0.N-1}$ such that no magnetic field may be induced in layer 38A (as shown in FIG. 2) of memory element 0.N-1 and consequently the digital value of memory element 0.N-1 may remain unchanged. In this manner, the row and column driver circuitry may be used to selectively write to individual memory elements within array 52.

The storage capacity of array 52 (and consequently the storage capacity of main memory 16), may depend on the number of individual memory elements contained in it. For example, array 52 may contain 64 rows by 256 columns of memory elements for a total of 16,384 memory elements or approximately 2 kilobytes ("KB") of storage space. Accordingly, in order to achieve greater storage capacities array 52 may need to contain many more memory elements. Because a typical memory chip may have several megabytes of storage space—e.g., 16 MB to 64 MB—the number of memory elements in array 52 may need to be large in order to achieve the desired amount of storage capacity.

Figure 5B:
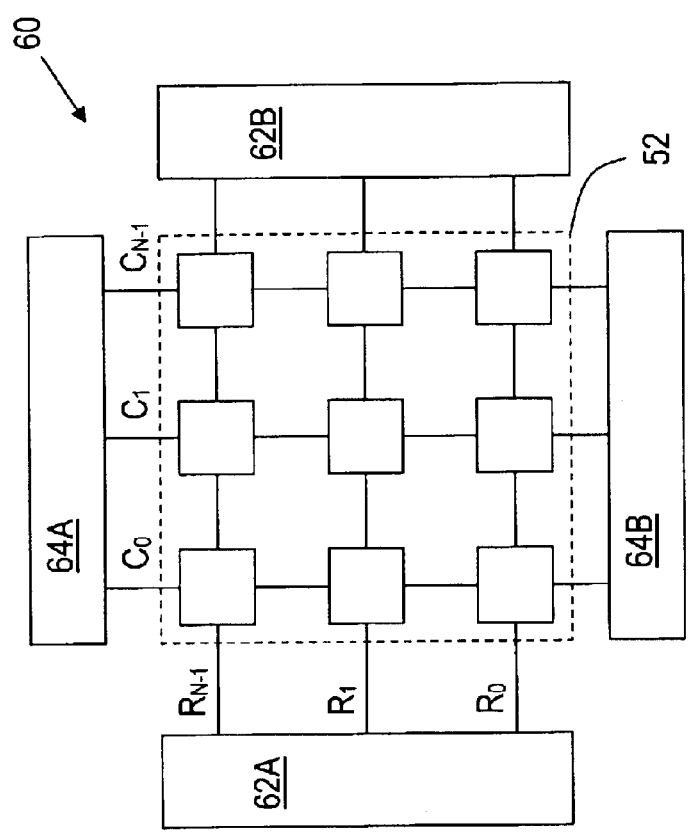
FIG. 5B shows an enlarged view of a sub-array that may be contained within the macro-array of FIG. 5A.
Figure 5A:
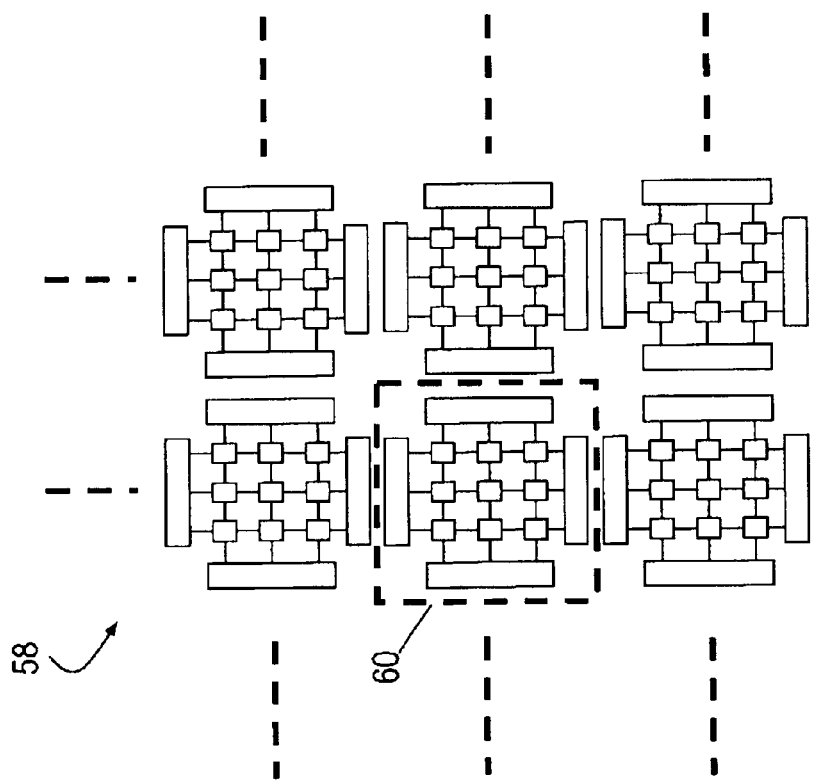
FIG. 5A shows a macro-array of memory elements.

FIG. 5A shows a macro-array 58 where a sub-array 60 may be replicated many times in order to achieve the desired memory capacity. FIG. 5B shows an enlarged view of sub-array 60, which includes the array of memory elements 52 shown in FIG. 4 as well as row and column driver circuitry. Referring to FIG. 5B, the array 52 may include N-1 rows coupled to row driver circuitry 62A-B, and N-1 columns coupled to column driver circuitry 64A-B. As discussed above, as the size of array 52 increases, the chip area occupied by row circuitry 62A-B and column circuitry 64A-B may increase disproportionately and have a negative effect on the overall cost of the chip.

In accordance with certain embodiments, repeater circuitry may be used to facilitate continuous write conductors across a magnetic memory array. Primary current drivers may be coupled to either end of the continuous write conductors and repeater circuitry may be located along the continuous write conductor path. With repeater circuitry located along the continuous write conductor desired portions of the write conductors may be isolated and memory elements within the isolated segment of the write conductor may be written to. By using repeater circuitry to facilitate continuous write conductors, the number of memory elements on the chip may be increased without drastic increases in the size of row and column driver circuitry. In addition, the primary drivers and repeater circuitry may include tri-state buffers to further isolate the portions of the continuous write conductor so that data may be conveyed along write lines during time periods when the write line is not being used for write purposes.

FIG. 6A shows a plurality of arrays 0 through N-1 that may include memory elements that may be coupled together using a write conductor 66. The write conductor 66 may be either a row or a column conductor that may couple multiple arrays together. Primary drivers 68A-B may be coupled to either end of the write conductor 66 as shown. Repeater circuitry 70A-B may also be coupled to the write conductor 66 so that individual portions of the write conductor 66 may be isolated and written to. The repeater circuitry 70A-B may include a PMOS transistor coupled between the write conductor 66 and a supply voltage $V_{WRITE}$. In addition, repeater circuitry 70A-B may also include an NMOS transistor coupled between the write conductor 66 and ground. With PMOS and NMOS transistors configured in this manner, repeater circuitry 70A-B may be capable of writing information to selected arrays.

For example, if it is desired to write information to array 1, then repeater circuitry 70A may have its output coupled to ground while repeater circuit 70B may have its output coupled to $V_{WRITE}$. Also, array 0 and array N-1 may be isolated if the output of primary driver 68A is coupled to $V_{WRITE}$ and the output of primary driver 68B is coupled to ground. In this manner, the individual portion of write conductor 66 between repeater circuit 70A and 70B (including the memory elements in the array 1), may be written to while other portions of the write conductor 66, including array 0 and array N-1, may be isolated.

The amount of current flowing in isolated portions of the write conductor 66 may flow in either direction so that magnetic memory elements within the various arrays may have their digital values changed. The size of the transistors within the repeater circuitry may be smaller than the primary circuitry because multiple repeater circuits may contribute their current sourcing and sinking capabilities. For example, in writing to array 0, primary driver 68B may couple the write conductor 66 to ground while repeater circuitry 70A and 70B, and primary driver 68A may be coupled to $V_{WRITE}$. Because the repeater circuitry 70A and 70B may both source current for primary driver 68B to sink, then each individual repeater circuit 70A and 70B may not need to contribute as much current for array 0 to be written to. Consequently, the size of the repeater circuitry 70A and 70B may be smaller.

As was mentioned above, there may be some cases in which the current in the write conductor 66 may only need to flow in one direction. For example, the current flowing in conductor 40 (shown in FIG. 2) may only need to flow in a single direction. Accordingly, FIG. 6B shows primary driver circuitry 72A-B and repeater circuitry 74A-B such that current may flow in a single direction through selected portions of write conductor 66. The primary driver circuitry 72A-B and the repeater circuitry 74A-B may comprise single transistors that may couple various portions of the write conductor 66 alternately to $V_{WRITE}$ or ground in order to write to memory elements within the arrays. For example, in writing to array 0, repeater circuitry 74A may couple a portion of the write conductor 66 above array 0 to $V_{WRITE}$, while primary circuitry 72B may couple the portion of the write conductor 66 below a array 0 to ground. Concurrently, primary driver 72A and 74B may be disabled so they do not affect the conduction state of write conductor 66. In this manner, current may flow through array 0 as indicated by the arrow. Thus, if the memory elements within the various arrays only need current to flow in a single direction, then the embodiment shown in FIG. 6B may allow a reduction in the required amount of write circuitry. Also, the amount of current in the write conductor may be adjusted to a desired value by adjusting $V_{WRITE}$.

The driver circuitry and the repeater circuitry shown in FIGS. 6A and 6B may be implemented using tri-state buffers. FIG. 6C shows a possible tri-state buffer that may be coupled to the continuous write conductor 66, having a truth table as shown in FIG. 6C. With the driver and repeater circuitry implemented using tri-state buffers, their output may be high-impedance (as indicated by the letter Z), so that the circuitry may be isolated from the write conductor 66, when the ENB terminal is high. The ability to isolate the driver and repeater circuitry from the continuous write conductor may be useful in routing signals to other areas of the chip as disclosed by commonly owned application Ser. No. 10/444,447, filed May 23, 2003.

Figure 7:
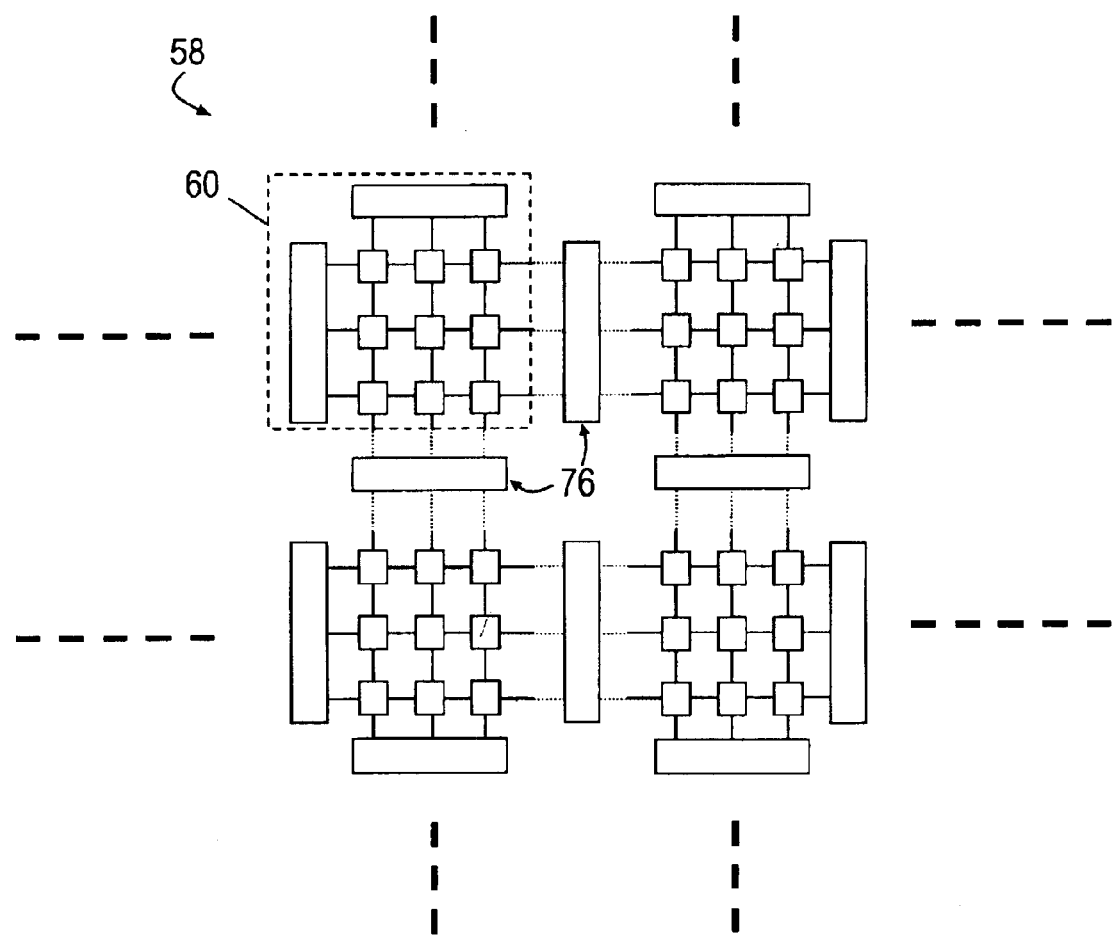
FIG. 7 shows a macro-array in accordance with various embodiments of the invention.

Advantages that may be realized by implementing write conductor repeater circuitry may include a reduction in the amount of chip area devoted to driver circuitry and an increase in the overall amount of chip area devoted to memory elements. Unlike FIG. 5A, where each sub-array 60 within the macro-array 58 includes dedicated row and column driver circuitry coupled to either end of the rows and columns, each sub array in FIG. 7 uses shared repeater circuitry 76. Implementing repeater circuitry as disclosed in the various embodiments may allow the various sub-arrays 60 within the macro-array 58 to utilize common repeater circuitry 76 to convey data along continuous write conductors that may span several sub-arrays as shown in FIG. 7. Sharing common repeater circuitry may allow more efficient use of the chip area by permitting more of the area to be devoted to memory elements than to driver circuitry.

The above discussion is meant to be illustrative of the principles and various embodiments of the present invention. Numerous variations and modifications will become apparent to those skilled in the art once the above disclosure is fully appreciated. For example, although the various embodiments are discussed in the context of a memory chip, it should be understood that the embodiments equally apply to other chips as well, such as microprocessors which incorporate magnetic memory elements. Also, although only two conductors are shown in conjunction with the magnetic memory elements, it should be understood that multiple conductor magnetic memory elements may benefit from the disclosed embodiments. It is intended that the following claims be interpreted to embrace all such variations and modifications.

What is claimed is:

1. A magnetic memory array that comprises:
   a plurality of magnetic memory elements arranged in a macro-array of subarrays;
   a write conductor having a first driver circuit at one end and a second driver circuit at an opposite end, wherein the write conductor is magnetically coupled to memory cells in more than one subarray; and
   a repeater circuit coupled to the write conductor, wherein the repeater circuit is configured to cooperate with the first and second driver circuits to cause a current flow in a selected subarray.

2. The memory array of claim 1, wherein the repeater circuit is coupled to predetermined locations along the write conductor, wherein the predetermined locations include segments of the conductor between adjacent subarrays.

3. The memory array of claim 1, wherein the driver circuits and the repeater circuits include a metal oxide semiconductor transistor.

4. The memory array of claim 3, wherein the repeater circuits comprise a single transistor.

5. The memory array of claim 1, wherein the driver circuits and the repeater circuits comprise a tri-state buffer.

6. The memory array of claim 5, wherein the impedance of the write conductor remains substantially unchanged when the tri-state buffer is in the high-impedance state.

7. The memory array of claim 1, wherein the repeater circuits are smaller than the driver circuits.

8. The memory array of claim 1, wherein memory elements located in separate subarrays can be isolated so that current flows only in desired memory elements.

9. The memory array of claim 8, wherein the repeater circuit maintains the write conductor's continuity while isolating the memory elements.

10. A method of writing information to a memory, comprising:
    coupling a plurality of memory arrays to a conductor, wherein the arrays include a memory element;
    coupling a plurality of current drivers to the conductor;
    isolating memory elements that are located in separate memory arrays using at least two of the current drivers;
    wherein the current driver are shared between more than one memory array; and
    wherein the current driver includes a means for maintaining at least a portion of the conductor in a high-impedance state.

11. The method of claim 10, wherein the current driver includes a transistor.

12. A method of writing information to a memory, comprising:
    coupling a plurality of memory arrays to a conductor, wherein the arrays include a memory element;
    coupling a plurality of current drivers to the conductor; and
    isolating memory elements that are located in separate memory arrays using at least two of the current drivers;
    wherein the current drivers are shared between more than one memory array; and
    wherein the current driver includes a means for maintaining at least a portion of the conductor in a high-impedance state,
    wherein isolating the memory elements includes coupling a portion of the conductor to a predetermined voltage and another portion of the conductor to ground.

13. A method of writing information to a memory, comprising:
    coupling a plurality of memory arrays to a conductor, wherein the arrays include a memory element;
    coupling a plurality of current drivers to the conductor; and
    isolating memory elements that are located in separate memory arrays using at least two of the current drivers;
    wherein the current drivers are shared between more than one memory array; and
    wherein the current driver includes a means for maintaining at least a portion of the conductor in a high-impedance state,
    wherein information is written to the isolated memory elements.

14. The memory array of claim 13, wherein information is not written to memory elements coupled to the conductor which are not isolated.

15. A memory, comprising:
    a plurality of memory arrays, wherein each memory array comprises a memory element;
    a conductor coupled to memory elements that are located in at least two separate memory arrays;
    means for non-invasively isolating memory elements in the separate memory arrays; and
    a current driver circuit coupled to the conductor at predetermined locations.

16. The memory of claim 15, wherein the predetermined locations include segments of the conductor between adjacent memory arrays.

17. The memory of claim 15, wherein the driver circuitry is shared between the memory arrays.

18. The memory of claim 17, wherein the current driver includes a means for maintaining at least a portion of the conductor in a high impedance state.

19. A memory, comprising:
    a plurality of memory arrays, wherein each memory array comprises a memory element;
    a conductor coupled to memory elements that are located in at least two separate memory arrays; and
    means for non-invasively isolating memory elements in the separate memory arrays;
    wherein the memory elements include magnetic memory elements.

20. The memory of claim 19, wherein said means for isolating includes a means for modifying a digital value of a memory element.

21. The memory of claim 19, wherein said means for isolating allows memory elements that are coupled to the conductor to be independently modified of other memory elements that are coupled to the conductor.

22. The memory of claim 19, wherein the means for non-invasively isolating memory elements comprise a tri-state buffer and the impedance of the conductor remains substantially unchanged when the tri-state buffer is in the high-impedance state.

* * * * *